(12) United States Patent
Mocanu et al.

(10) Patent No.: US 12,230,988 B2
(45) Date of Patent: Feb. 18, 2025

(54) CONSTANT CURRENT CHARGING CAPACITOR TEST

(71) Applicant: Intel Corporation, Santa Clara, CA (US)

(72) Inventors: Adrian Mocanu, Langley (CA); Zeljko Zupanc, Vancouver (CA); Derrick Wilson, North Vancouver (CA); Andrew Morning-Smith, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 662 days.

(21) Appl. No.: 17/383,865

(22) Filed: Jul. 23, 2021

(65) Prior Publication Data

US 2021/0351595 A1  Nov. 11, 2021

(51) Int. Cl.
*G11C 5/14* (2006.01)
*G11C 5/10* (2006.01)
*H02J 7/00* (2006.01)
*H02J 7/34* (2006.01)

(52) U.S. Cl.
CPC .............. *H02J 7/005* (2020.01); *G11C 5/10* (2013.01); *G11C 5/14* (2013.01); *G11C 5/141* (2013.01); *G11C 5/145* (2013.01); *H02J 7/007182* (2020.01); *H02J 7/345* (2013.01)

(58) Field of Classification Search
CPC ...... H02J 7/005; H02J 7/007182; H02J 7/345; H02J 2207/50; G11C 5/14; G11C 5/145; G11C 2029/5002; G11C 29/021; G11C 29/50; H02M 3/155
USPC ......................................................... 365/226
See application file for complete search history.

(56) References Cited

U.S. PATENT DOCUMENTS

2012/0224445 A1*  9/2012  Hauck .................... G01R 31/64
                                                          365/229

OTHER PUBLICATIONS

Sper Capacitor Manager (Year: 2011).*
Super Capacitor Manager (Year: 2011).*

* cited by examiner

*Primary Examiner* — Tha-O H Bui
(74) *Attorney, Agent, or Firm* — Jordan IP Law, LLC

(57) ABSTRACT

Systems, apparatuses and methods may provide for technology that applies a constant current to a capacitor, wherein the constant current causes a linear voltage increase in the capacitor, and determines a capacitance based on the constant current, a voltage change in the capacitor during the linear voltage increase, and a time change corresponding to the voltage change.

18 Claims, 5 Drawing Sheets

CONSTANT CURRENT CHARGING CAPACITOR TEST

TECHNICAL FIELD

Embodiments generally relate to memory structures. More particularly, embodiments relate to constant current charging capacitor tests.

BACKGROUND

Solid State Drives (SSDs) that are deployed in enterprise environments typically have a unique requirement for a controlled shutdown when a power loss is encountered. Additionally, the SSDs may use a holdup energy reserve (e.g., a capacitor or bank of capacitors) to provide extra time to conduct an orderly shutdown, save in-flight data, and maintain data integrity. The holdup capacitor(s) may be monitored by a power management integrated circuit (PMIC) to ensure that the health and aging of the capacitor(s) is within specifications.

For example, capacitor health checks may be conducted during boot up of the SSD by applying a current to a fully charged holdup capacitor, discharging the capacitor, measuring the time taken to discharge the capacitor by a predetermined voltage, and using the voltage/current relationship of the capacitor to determine whether the actual capacitance of the capacitor is as expected (e.g., if not, the capacitor may be deemed unhealthy). Such an approach may extend SSD bootup time because the health check is conducted after the capacitor has been charged to the full operating voltage. Additionally, leakage current, which may occur when the capacitor is first biased with a voltage after exposure to high temperatures (e.g., baking, reflow), may lead to false failures and/or yield loss during manufacturing. Moreover, the capacitor may suffer from unknown equivalent series resistance (ESR), which defines how effectively the capacitor can supply energy to the SSD.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
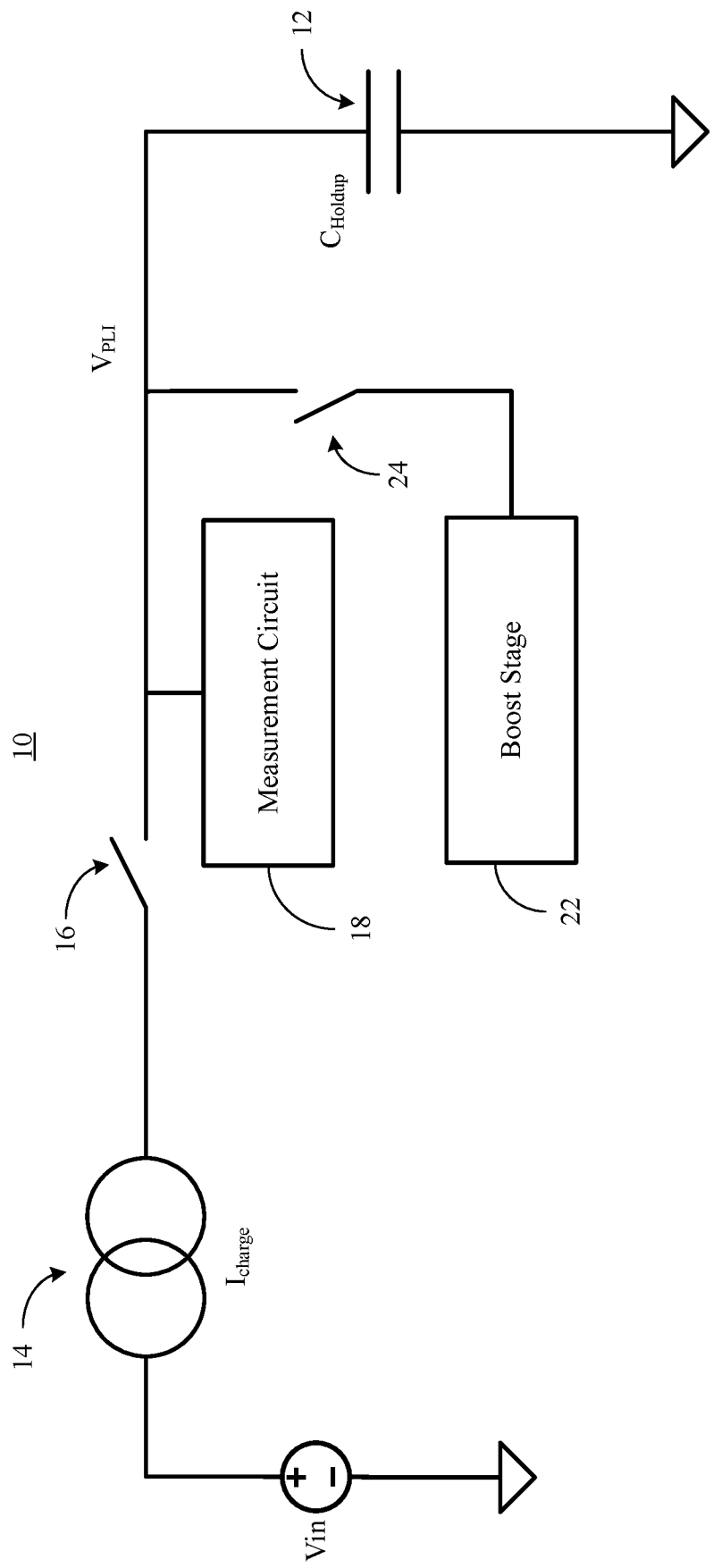
FIG. 1 is a schematic diagram of an example of a power management subsystem according to an embodiment.

Turning now to FIG. 1, a power management subsystem 10 (e.g., PMIC) is shown in which a charge circuit 14 is coupled to a capacitor 12 (e.g., SSD holdup and/or power loss imminent/PLI capacitor) via a first switch 16 (e.g., transistor). During operation, the power management subsystem 10 closes the first switch 16 and the charge circuit 14 applies a constant current to the capacitor 12. In an embodiment, the constant current is fixed and stable to a relatively high level of precision (e.g., ±5%). In one example, the constant current is applied during a boot of an SSD containing the power management subsystem 10. As will be discussed in greater detail, the constant current causes a linear voltage increase (e.g., a linear phase) in the capacitor 12. Additionally, a measurement circuit 18 is coupled to the capacitor 12. During operation, the measurement circuit 18 determines the capacitance of the capacitor 12 based on the constant current, a voltage change in the capacitor 12 during the linear voltage increase, and a time change corresponding to the voltage change.

Figure 2:
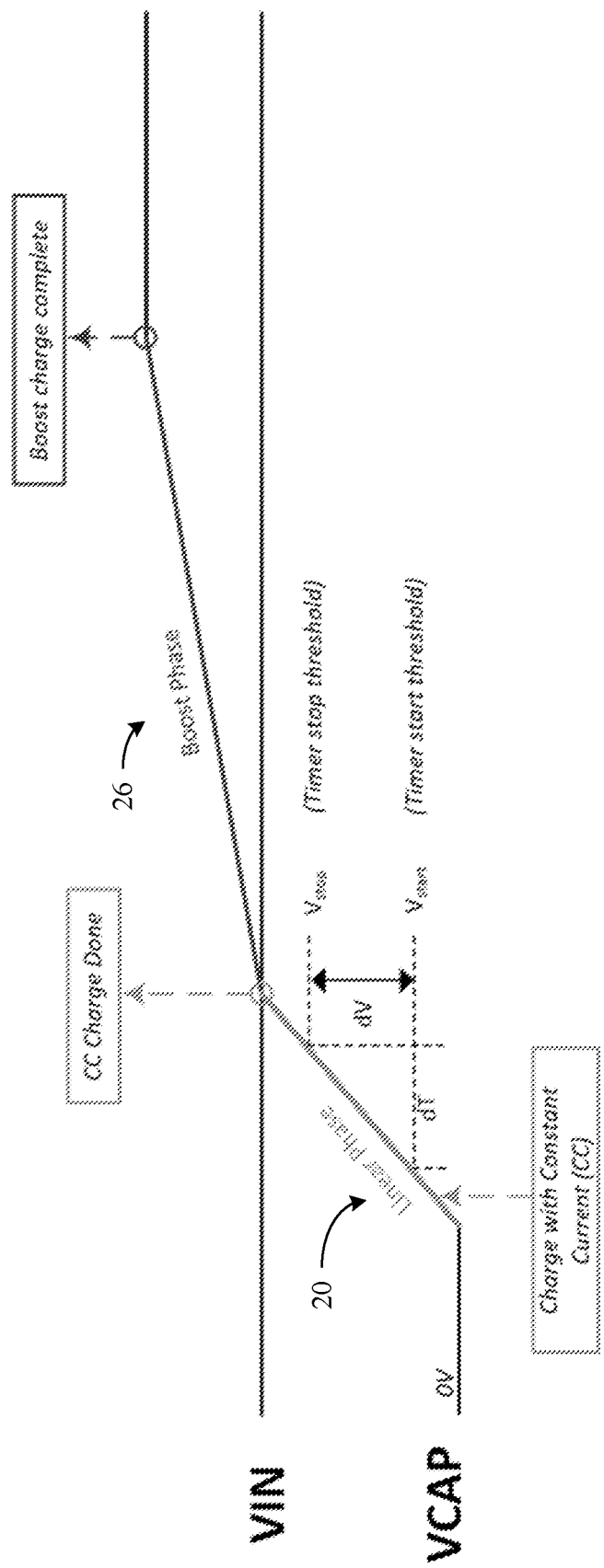
FIG. 2 is a plot of an example of a capacitor voltage curve during a capacitor health check according to an embodiment.

With continuing reference to FIGS. 1 and 2, the charge circuit 14 includes a precision constant current source to charge the capacitor 12 during a linear phase 20 of a capacitor voltage (VCAP) waveform. While charging the capacitor 12, the measurement circuit 18 can measure the ramp rate to determine the actual capacitance of the capacitor 12. In an embodiment, the measurement circuit 18 includes two comparators (not shown), which when triggered will start and stop an internal timer (e.g., on-silicon trimmed timer) when the voltage exceeds the respective thresholds of the comparators. Thus, crossing the first threshold starts the timer and crossing the second threshold stops the timer.

The capacitance can then be calculated by rearranging the following formula.

$$i = C * \frac{dV}{dT} \tag{1}$$

Giving the following.

$$C = i * \frac{dT}{dV} \tag{2}$$

$$C = i * \frac{dT}{(V_{stop} - V_{start})} \tag{3}$$

Where dT is the value of the timer and i is the constant current used to charge the capacitor 12.

In an embodiment, the measurement circuit 18 also conducts a health check (e.g., a subset of the data reported over Self-Monitoring, Analysis and Reporting Technology/ SMART) of the capacitor 12 based on the capacitance before completion of a boost phase with respect to the capacitor 12. In this regard, the illustrated power management subsystem 10 also includes a boost stage 22 coupled to the capacitor 12 via a second switch 24. Thus, the power management subsystem 10 may close the first switch 16, open the second switch 24, and use the boost stage 22 to charge the capacitor 12 to an operating voltage that is greater than the input voltage (VIN). The power management subsystem 10 enhances performance at least to the extent that determining the capacitance of the capacitor 12 based on the constant current, the voltage change during the linear voltage increase, and the time change corresponding to the voltage change enables the health check to be conducted before the capacitor has been charged to the full operating voltage (e.g., reducing SSD bootup time). Additionally, the power management subsystem 10 eliminates false failures and/or yield loss during manufacturing after exposure to high temperatures (e.g., baking, reflow) because leakage current when the capacitor 12 is first biased is eliminated from the capacitance measurement.

Figure 3:
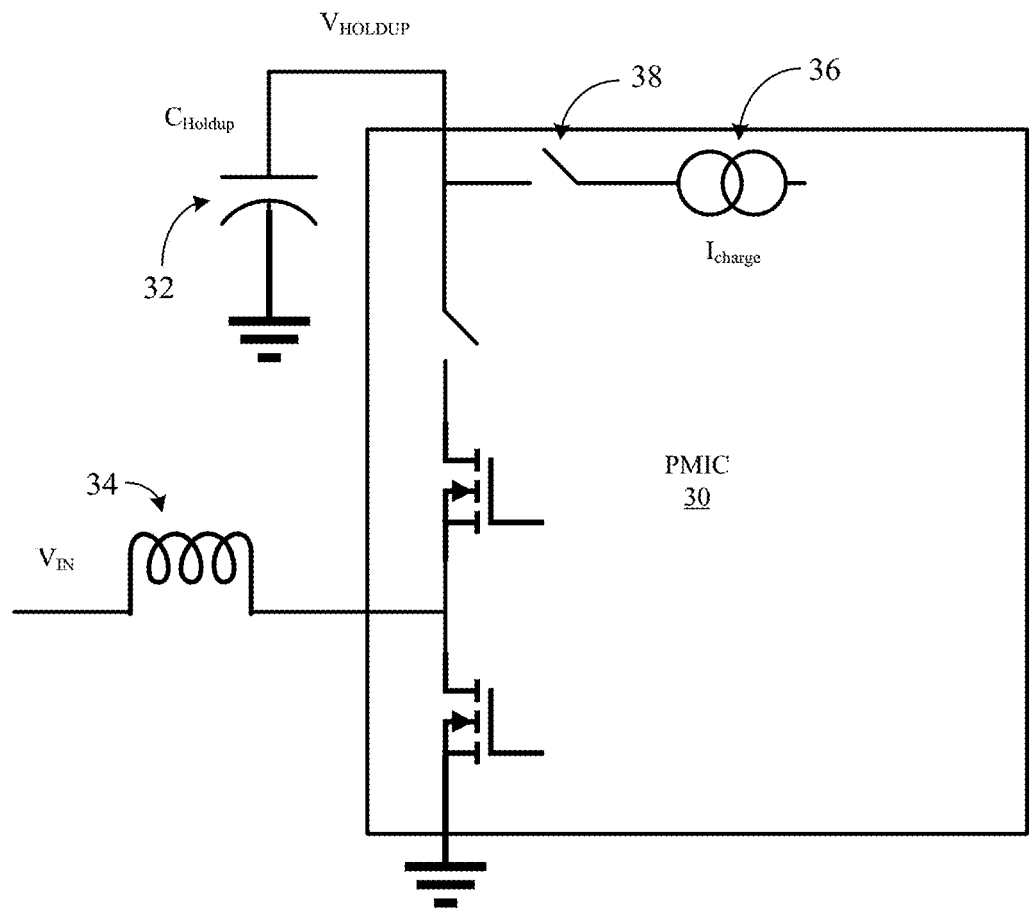
FIG. 3 is a schematic diagram of an example of a PMIC according to an embodiment.

FIG. 3 shows a PMIC 30 that is coupled to a capacitor 32 and a boost stage 34. In the illustrated example, the PMIC 30 includes a precision constant current source 36 that charges the capacitor 32 through a first switch 38 during a linear phase. As already noted, the PMIC 30 may determine the capacitance of the capacitor 32 based on measurements taken during the linear phase. In an embodiment the PMIC 30 alternatively switches internal field effect transistors (FETs) to boost the charge of the capacitor 32 beyond the input voltage.

Figure 4:
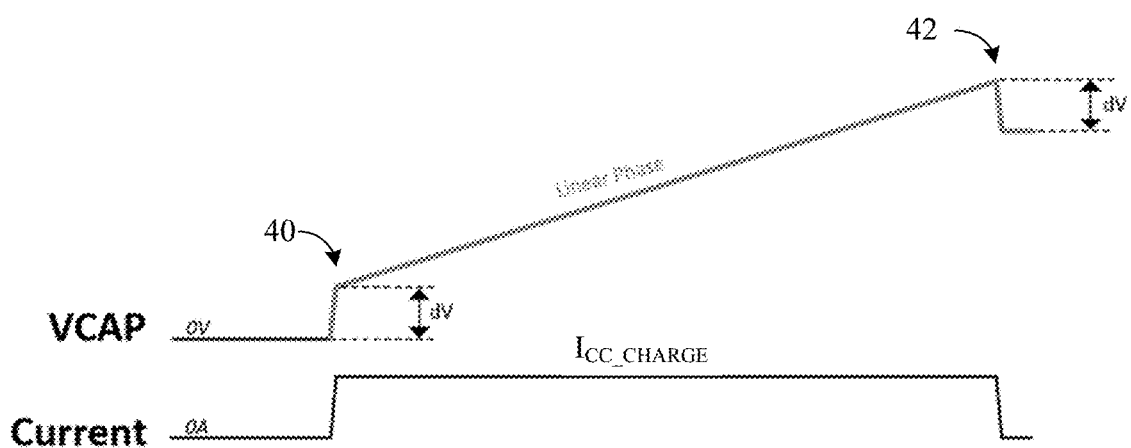
FIG. 4 is a plot of an example of a capacitor voltage curve that exhibits instantaneous voltage shifts according to an embodiment.

FIG. 4 demonstrates that, in addition to verifying the capacitance, the constant current charge may be used verify that the ESR of the capacitor is acceptable. More particularly, when the current is first applied, the capacitor ESR causes a first near instantaneous shift 40 in voltage. Similarly, a second near instantaneous shift 42 may also be observed when the current is removed. Given that the constant current is known, the voltage shift can be measured, enabling the calculation of the ESR using Ohms law.

$$V = I*R \quad (4)$$

Given the following.

$$ESR = \frac{dV}{I_{CC\_CHARGE}} \quad (5)$$

In an embodiment, the second near instantaneous shift 42 at the end of the constant current charge (e.g., just after the current drops from ICC_CHARGE to 0A) is used to determine the ESR to support pre-biased startups (e.g., configurations in which the capacitor voltage does not start at 0 Volts/V). Thus, the illustrated solution further enhances performance by automatically detecting ESR, which defines how effectively the capacitor can supply energy to the SSD and may be indicative of the quality of the solder connection. Indeed, an ESR that is too high can result in excessive voltage droops and/or thermal/reliability issues in high current and ripple scenarios. Moreover, capacitors with excessive ESR or poor solder joint connections may pass initial manufacturing tests and fail shortly after shipment due to vibrations or thermal cycling. The illustrated solution makes these failures easier to debug even when inconsistent failure modes are present.

Figure 5:
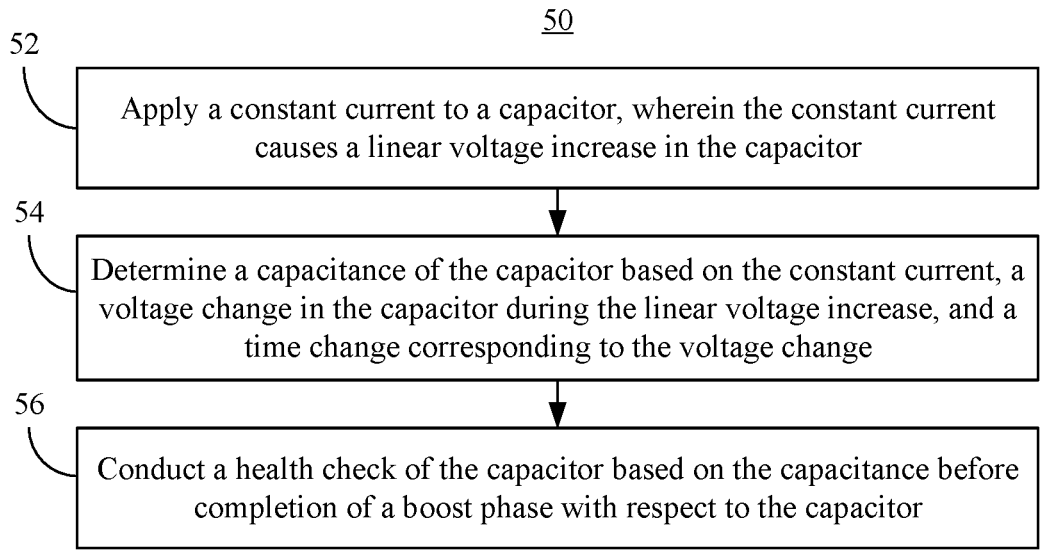
FIGS. 5 and 6 are flowcharts examples of methods of operating a power management subsystem according to an embodiment.

FIG. 5 shows a method 50 of operating a power management subsystem. The method 50 may generally be implemented in a power management subsystem such as, for example, the power management subsystem 10 (FIG. 1) and/or the PMIC 30 (FIG. 3), already discussed. More particularly, the method 50 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), FPGAs, complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated processing block 52 applies a constant current to a capacitor, wherein the constant current causes a linear voltage increase in the capacitor. In one example, the constant current is applied during a boot of an SSD and the capacitor is an SSD holdup capacitor. Block 54 determines the capacitance of the capacitor based on the constant current, a voltage change in the capacitor during the linear voltage increase, and a time change corresponding to the voltage change. Block 56 may conduct a health check (e.g., SMART test) of the capacitor based on the capacitance before completion of (e.g., in parallel with) a boost phase with respect to the capacitor. In an embodiment, the boost phase involves charging the capacitor to a voltage that is greater than an input voltage.

The method 50 therefore enhances performance at least to the extent that determining the capacitance of the capacitor based on the constant current, the voltage change during the linear voltage increase, and the time change corresponding to the voltage change enables the health check to be conducted before the capacitor has been charged to the full operating voltage (e.g., reducing SSD bootup time). Additionally, the method 50 eliminates false failures and/or yield loss during manufacturing after exposure to high temperatures (e.g., baking, reflow) because leakage current when the capacitor is first biased is eliminated from the capacitance measurement.

Figure 6:
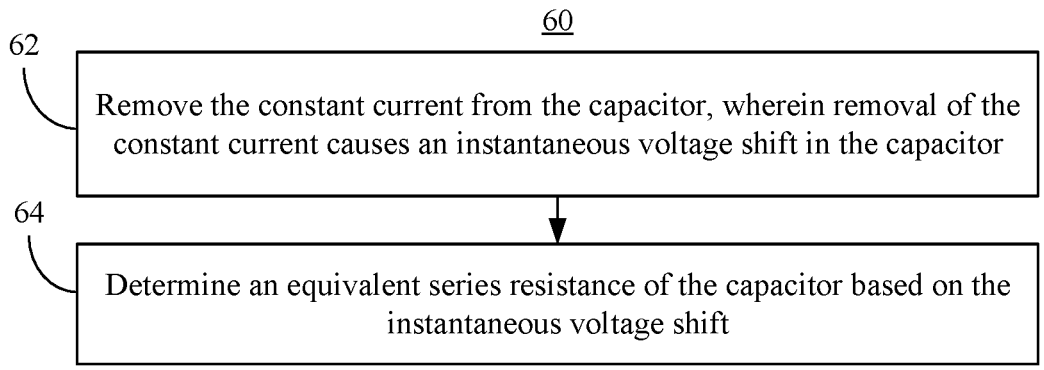

FIG. 6 shows another method 60 of operating a power management system. The method 60 may generally be implemented in a power management subsystem such as, for example, the power management subsystem 10 (FIG. 1) and/or the PMIC 30 (FIG. 3) already discussed. More particularly, the method 60 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 62 removes the constant current from the capacitor, wherein removal of the constant current causes an instantaneous voltage shift in the capacitor. In an embodiment, the constant current is removed from the capacitor when the capacitor reaches an input voltage. Block 64 may determine an ESR of the capacitor based on the instantaneous voltage shift. In one example, block 64 automatically calculates and/or determines equation (5), already discussed. Thus, the illustrated method 60 further enhances performance by automatically detecting ESR, which defines how effectively the capacitor can supply energy to the SSD and may be indicative of the quality of the solder connection.

Figure 7:
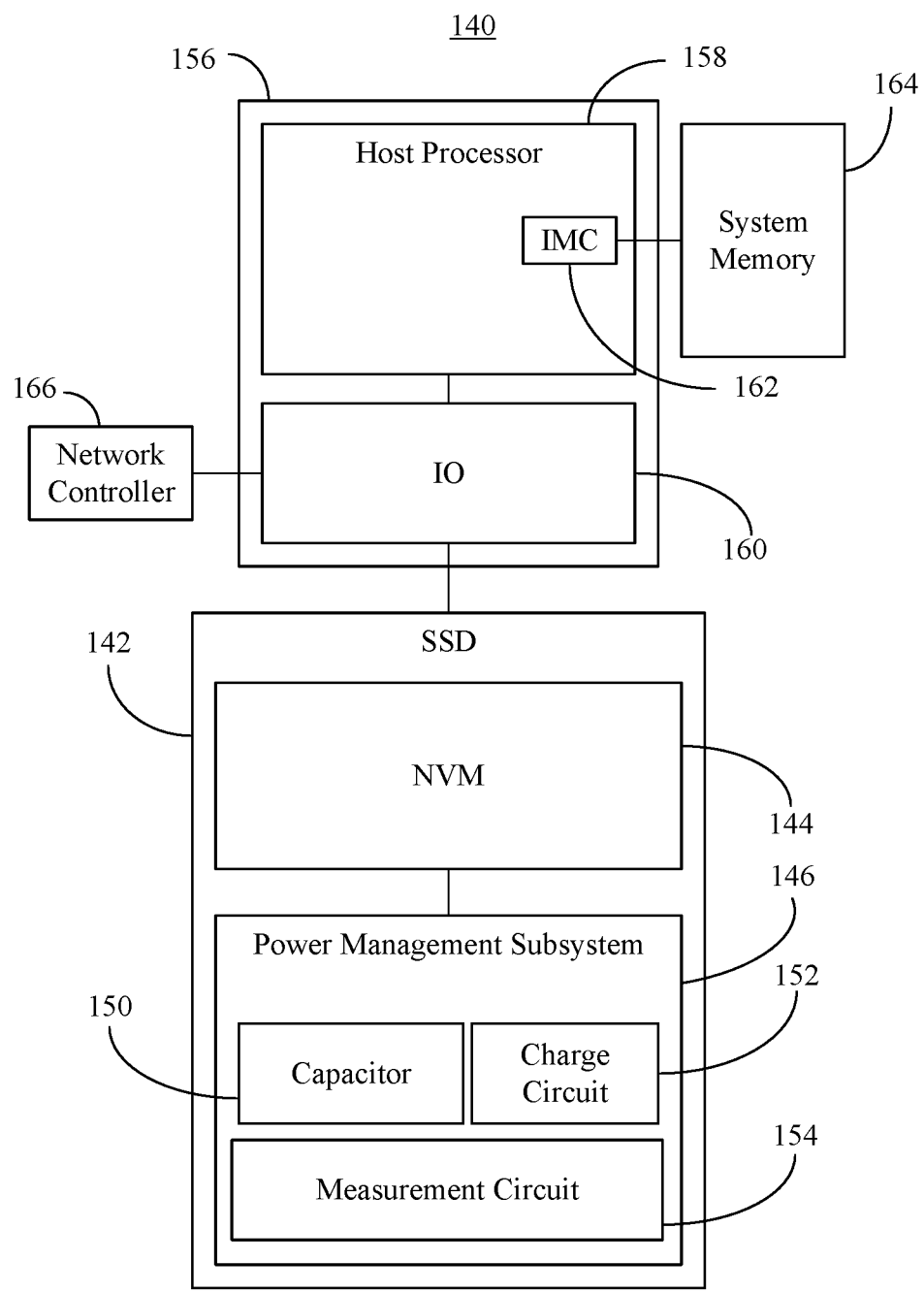
FIG. 7 is a block diagram of an example of a performance-enhanced computing system according to an embodiment.

Turning now to FIG. 7, a performance-enhanced computing system 140 is shown. The illustrated system 140 includes a system on chip (SoC) 156 having a host processor 158 (e.g., central processing unit/CPU) and an input/output (IO) module 160. The host processor 158 may include an integrated memory controller 162 (IMC) that communicates with system memory 164 (e.g., RAM dual inline memory modules/DIMMs). The illustrated IO module 160 is coupled to an SSD 142 as well as other system components such as a network controller 166.

The illustrated SSD 142 includes a non-volatile memory 144 and a power management subsystem 146 coupled to the NVM 144. the power management subsystem 146 includes a capacitor 150 (e.g., holdup capacitor including polymer tantalum, which potentially exhibits initial leakage current)

and a charge circuit 152 coupled to the capacitor 150, wherein the charge circuit 152 is to apply a constant current to the capacitor 150. Additionally, the constant current causes a substantially linear increase in the capacitor 150. The illustrated power management subsystem 146 also includes a measurement circuit 154 coupled to the capacitor 150, wherein the measurement circuit 154 is to determine a capacitance of the capacitor 150 based on the constant current, a voltage change in the capacitor during the linear voltage increase, and a time change corresponding to the voltage change. In an embodiment, the measurement circuit 154 also conducts a health check of the capacitor 150 based on the capacitance before completion of a boost phase with respect to the capacitor 150.

The computing system 140 is considered performance-enhanced at least to the extent that determining the capacitance of the capacitor 150 based on the constant current, the voltage change during the linear voltage increase, and the time change corresponding to the voltage change enables the health check to be conducted before the capacitor 150 has been charged to the full operating voltage (e.g., reducing SSD bootup time). Additionally, the computing system 140 eliminates false failures and/or yield loss during manufacturing after exposure to high temperatures (e.g., baking, reflow) because leakage current when the capacitor 150 is first biased is eliminated from the capacitance measurement.

Additional Notes and Examples:

Example 1 includes a solid state drive (SSD) comprising a non-volatile memory (NVM) and a power management subsystem coupled to the NVM, the power management subsystem comprising a capacitor, a charge circuit coupled to the capacitor, wherein the charge circuit is to apply a constant current to the capacitor, and wherein the constant current causes a linear voltage increase in the capacitor, and a measurement circuit coupled to the capacitor, wherein the measurement circuit is to determine a capacitance of the capacitor based on the constant current, a voltage change in the capacitor during the linear voltage increase, and a time change corresponding to the voltage change.

Example 2 includes the SSD of Example 1, wherein the measurement circuit is to conduct a health check of the capacitor based on the capacitance before completion of a boost phase with respect to the capacitor.

Example 3 includes the SSD of Example 1, wherein the charge circuit is to remove the constant current from the capacitor, wherein removal of the constant current causes an instantaneous voltage shift at the capacitor, and wherein the measurement circuit is to determine an equivalent series resistance of the capacitor based on the instantaneous voltage shift.

Example 4 includes the SSD of Example 3, wherein the constant current is removed from the capacitor when the capacitor reaches an input voltage.

Example 5 includes the SSD of Example 3, wherein the power subsystem further includes a boost stage coupled to the capacitor, and wherein the boost stage is to charge the capacitor to a voltage that is greater than an input voltage.

Example 6 includes the SSD of any one of Examples 1 to 5, wherein the constant current is applied during a boot of the SSD.

Example 7 includes a power management subsystem comprising a capacitor, a charge circuit coupled to the capacitor, wherein the charge circuit is to apply a constant current to the capacitor, and wherein the constant current causes a linear voltage increase in the capacitor, and a measurement circuit coupled to the capacitor, wherein the measurement circuit is to determine a capacitance of the capacitor based on the constant current, a voltage change in the capacitor during the linear voltage increase, and a time change corresponding to the voltage change.

Example 8 includes the power management subsystem of Example 7, wherein the measurement circuit is to conduct a health check of the capacitor based on the capacitance before completion of a boost phase with respect to the capacitor.

Example 9 includes the power management subsystem of Example 7, wherein the charge circuit is to remove the constant current from the capacitor, wherein removal of the constant current causes an instantaneous voltage shift at the capacitor, and wherein the measurement circuit is to determine an equivalent series resistance of the capacitor based on the instantaneous voltage shift.

Example 10 includes the power management subsystem of Example 9, wherein the constant current is removed from the capacitor when the capacitor reaches an input voltage.

Example 11 includes the power management subsystem of Example 9, further including a boost stage coupled to the capacitor, and wherein the boost stage is to charge the capacitor to a voltage that is greater than an input voltage.

Example 12 includes the power management subsystem of Example 7, wherein the constant current is applied during a boot of a solid state drive containing the power management subsystem.

Example 13 includes the power management subsystem of any one of Examples 7 to 12, wherein the capacitor is a solid state drive holdup capacitor.

Example 14 includes a method of operating a power management subsystem, the method comprising applying a constant current to a capacitor, wherein the constant current causes a linear voltage increase in the capacitor, and determining a capacitance of the capacitor based on the constant current, a voltage change in the capacitor during the linear voltage increase, and a time change corresponding to the voltage change.

Example 15 includes the method of Example 14, further including conducting a health check of the capacitor based on the capacitance before completion of a boost phase with respect to the capacitor.

Example 16 includes the method of Example 14, further including removing the constant current from the capacitor, wherein removal of the constant current causes an instantaneous voltage shift in the capacitor, and determining an equivalent series resistance of the capacitor based on the instantaneous voltage shift.

Example 17 includes the method of Example 16, wherein the constant current is removed from the capacitor when the capacitor reaches an input voltage.

Example 18 includes the method of Example 16, further including charging the capacitor to a voltage that is greater than an input voltage.

Example 19 includes the method of Example 14, wherein the constant current is applied during a boot of a solid state drive.

Example 20 includes the method of any one of Examples 14 to 19, wherein the capacitor is a solid state drive holdup capacitor.

Example 21 includes means for performing the method of any one of Examples 14 to 19.

Technology described herein therefore eliminates any need for staging time and/or unwanted delays in the manufacturing process. The technology also avoids cherry picking capacitors, which would otherwise reduce the number of available manufacturers and/or constrain supply chains. In addition, the technology reduces capacitor cost and is more effective at detecting failures (e.g., even in the presence of temporary leakage). The more effective failure detection is because traditional "discharge" tests apply very little current (e.g., 1 milliAmps/mA). The technology described herein avoids discharging the capacitor significantly while the SSD is operating. At this point, the leakage can play a significant role in the discharge test accuracy. When charging, the technology can charge with a current that is orders of magnitude higher (e.g., hundreds of mA). Accordingly, the leakage is negligible, giving better accuracy for parts exhibiting temporary leakage.

This significantly higher charge current is also what enables ESR measurement (e.g., creating a larger/measurable voltage shift). Moreover, performing the capacitor health check simultaneously while charging the capacitor to the full operating voltage enables a faster overall SSD boot up sequence. For example, the technology enables a boot time reduction on the order of 1 second—a significant improvement considering that the requirement may be <2 s.

As already noted, compared to traditional discharge tests (e.g., which use a relatively small test current), the technology described herein charges the capacitor with a constant current that is significantly higher than the temporary leakage current that some capacitors can show. By increasing the signal (e.g., high test current) to noise (e.g., impact of the leakage current), the technology brings the test accuracy to acceptable levels. Indeed, the higher constant current also enables detection of capacitors with defective ESR or solder joint issues.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A solid state drive (SSD) comprising:
a non-volatile memory (NVM); and
a power management subsystem coupled to the NVM, the power management subsystem comprising:
   a capacitor,
   a charge circuit coupled to the capacitor via a first switch, wherein the charge circuit is to apply a constant current to the capacitor, and wherein the constant current causes a linear voltage increase in the capacitor,
   a boost stage coupled to the capacitor via a second switch, wherein the boost stage is separate from the charge circuit and is to charge the capacitor to a voltage that is greater than an input voltage, and
   a measurement circuit coupled to the capacitor, wherein the measurement circuit is to determine a capacitance of the capacitor based on the constant current, a voltage change in the capacitor during the linear voltage increase, and a time change corresponding to the voltage change.

2. The SSD of claim 1, wherein the measurement circuit is to conduct a health check of the capacitor based on the capacitance before completion of a boost phase with respect to the capacitor.

3. The SSD of claim 1, wherein the charge circuit is to remove the constant current from the capacitor, wherein removal of the constant current causes an instantaneous voltage shift at the capacitor, and wherein the measurement circuit is to determine an equivalent series resistance of the capacitor based on the instantaneous voltage shift.

4. The SSD of claim 3, wherein the constant current is removed from the capacitor when the capacitor reaches an input voltage.

5. The SSD of claim 1, wherein the constant current is applied during a boot of the SSD.

6. A power management subsystem comprising:
a capacitor;
a charge circuit coupled to the capacitor via a first switch, wherein the charge circuit is to apply a constant current to the capacitor, and wherein the constant current causes a linear voltage increase in the capacitor;

a boost stage coupled to the capacitor via a second switch, wherein the boost stage is separate from the charge circuit and is to charge the capacitor to a voltage that is greater than an input voltage, and a measurement circuit coupled to the capacitor, wherein the measurement circuit is to determine a capacitance of the capacitor based on the constant current, a voltage change in the capacitor during the linear voltage increase, and a time change corresponding to the voltage change.

7. The power management subsystem of claim 6, wherein the measurement circuit is to conduct a health check of the capacitor based on the capacitance before completion of a boost phase with respect to the capacitor.

8. The power management subsystem of claim 6, wherein the charge circuit is to remove the constant current from the capacitor, wherein removal of the constant current causes an instantaneous voltage shift at the capacitor, and wherein the measurement circuit is to determine an equivalent series resistance of the capacitor based on the instantaneous voltage shift.

9. The power management subsystem of claim 8, wherein the constant current is removed from the capacitor when the capacitor reaches an input voltage.

10. The power management subsystem of claim 6, wherein the constant current is applied during a boot of a solid state drive containing the power management subsystem.

11. The power management subsystem of claim 6, wherein the capacitor is a solid state drive holdup capacitor.

12. A method comprising:
applying, using a charge circuit coupled to a capacitor via a first switch, a constant current to the capacitor, wherein the constant current causes a linear voltage increase in the capacitor;
charging, using a boost stage coupled to the capacitor via a second switch, the capacitor to a voltage that is greater than an input voltage, wherein the boost stage is separate from the charge circuit, and
determining a capacitance of the capacitor based on the constant current, a voltage change in the capacitor during the linear voltage increase, and a time change corresponding to the voltage change.

13. The method of claim 12, further including conducting a health check of the capacitor based on the capacitance before completion of a boost phase with respect to the capacitor.

14. The method of claim 12, further including:
removing the constant current from the capacitor, wherein removal of the constant current causes an instantaneous voltage shift in the capacitor; and
determining an equivalent series resistance of the capacitor based on the instantaneous voltage shift.

15. The method of claim 14, wherein the constant current is removed from the capacitor when the capacitor reaches an input voltage.

16. The method of claim 14, further including charging the capacitor to a voltage that is greater than an input voltage.

17. The method of claim 12, wherein the constant current is applied during a boot of a solid state drive.

18. The method of claim 12, wherein the capacitor is a solid state drive holdup capacitor.

* * * * *